United States Patent [19]
Runkel

[11] Patent Number: 5,905,400
[45] Date of Patent: May 18, 1999

[54] CIRCUIT CONFIGURATION FOR GENERATING A BOOSTED OUTPUT VOLTAGE

[75] Inventor: Patrick Runkel, München, Germany

[73] Assignee: Siemens Aktiengesellschaft, Munich, Germany

[21] Appl. No.: 08/989,669

[22] Filed: Dec. 12, 1997

[30] Foreign Application Priority Data

Dec. 12, 1996 [DE] Germany ............................ 196 51 768

[51] Int. Cl.[6] .................................................. H03K 17/16
[52] U.S. Cl. ............................................ 327/390; 327/537
[58] Field of Search .................................... 327/390, 536, 327/537, 589; 326/88, 92

[56] References Cited

U.S. PATENT DOCUMENTS

| | | | |
|---|---|---|---|
| 5,184,030 | 2/1993 | Chung | 307/296.01 |
| 5,216,290 | 6/1993 | Childers | 307/296.1 |
| 5,677,645 | 10/1997 | Merritt | 327/536 |
| 5,703,827 | 12/1997 | Leung | 365/230.06 |
| 5,805,509 | 9/1998 | Leung | 365/189.09 |
| 5,831,470 | 11/1998 | Park | 327/536 |

FOREIGN PATENT DOCUMENTS 0 635 837 A2  1/1995  European Pat. Off. .

*Primary Examiner*—Terry D. Cunningham
*Assistant Examiner*—Maria Hasanzadah
*Attorney, Agent, or Firm*—Herbert L. Lerner; Laurence A. Greenberg

[57] ABSTRACT

A circuit configuration for generating an output voltage which is boosted beyond a supply voltage includes a boosting capacitor that is connected through a p-channel MOS transistor to an output node. A control circuit ensures that first of all the boosting capacitor and the output node are precharged through the use of respective precharging transistors when the p-channel MOS transistor is turned on, and that subsequently, during a shifting phase, the gate terminal of the p-channel MOS transistor is held at a floating potential. This prevents the voltage present between the gate and the main current path terminals of the p-channel MOS transistor from becoming greater than the supply voltage.

7 Claims, 2 Drawing Sheets

CIRCUIT CONFIGURATION FOR GENERATING A BOOSTED OUTPUT VOLTAGE

BACKGROUND OF THE INVENTION

FIELD OF THE INVENTION

The invention relates to a circuit configuration for generating a boosted output voltage, having a p-channel MOS transistor and a boosting capacitor.

Such circuit configurations, which generate an output voltage that is boosted above the applied supply voltage, are employed in a large number of semiconductor circuits, in particular in semiconductor memories. A single-transistor memory cell of a semiconductor memory, for example of a DRAM, includes a storage capacitor for storing an information bit as well as a transfer transistor through which access is made to the memory cell by the storage capacitor being connected to a word line through the main current path of the transfer transistor. In order to store an information bit at the level of the complete level of the supply voltage in the cell, it is necessary for the gate potential at the transfer transistor to lie above the supply voltage by that transistor's own threshold voltage. However, due to the usually small channel width of the transfer transistor and the high substrate-source voltage thereof, the threshold voltage is relatively high.

A circuit configuration for generating the boosted voltage for driving a transfer transistor in a semiconductor memory is described in Published European Patent Application 0 635 837 A2. A charge pump shown therein contains a p-channel MOS transistor through which a charging capacitor on the output side is charged by a boosting capacitor. The charging operation is controlled by an oscillator and is carried out continuously, with the output voltage being permanently present. Therefore, additional switches are necessary in order to forward the boosted voltage to the transfer transistor. While the gate terminal of the p-channel MOS transistor is at 0V, one of the terminals of its main current path is already connected to the output voltage which is applied to the charging capacitor and is boosted beyond the supply voltage. The gate oxide of the p-channel charging transistor is exposed to elevated voltage stress. Furthermore, the voltage present between the terminals of the main current path of the load transistor changes its direction during the pumping operation. Therefore, special measures are described for avoiding current flow in the doping well in which the charging transistor is disposed.

SUMMARY OF THE INVENTION

It is accordingly an object of the invention to provide a circuit configuration for generating a boosted output voltage, which overcomes the hereinafore-mentioned disadvantages of the heretofore-known devices of this general type and in which a p-channel MOS charging transistor is subjected to less voltage stress.

With the foregoing and other objects in view there is provided, in accordance with the invention, a circuit configuration for generating a boosted output voltage, comprising an output terminal for tapping a boosted output voltage; a p-channel MOS transistor having a main current path connected to the output terminal and having a gate terminal; a boosting capacitor having one terminal connected to and another terminal remote from the main current path of the p-channel MOS transistor; a first precharging transistor connected to the output terminal; a second precharging transistor connected to the boosting capacitor; and a control circuit for ensuring that during a first phase the gate terminal of the p-channel MOS transistor is held at a low potential and the precharging transistors are turned on, that during a second phase the gate terminal of the p-channel MOS transistor has a floating potential, and that the other terminal of the boosting capacitor has a low potential during the first phase and a high potential during the second phase.

As a result of the fact that the gate potential of the charging transistor is kept floating during the charge pumping phase, instances of impermissibly high voltage loading on the gate oxide are avoided. In this case, the pumping phase is that time period during which the output voltage is raised beyond the supply voltage. As a result of the parasitic capacitances at the charging transistor, the gate potential is incorporated during the voltage boosting, with the result that the transistor remains in the on state. However, the voltages between the gate and the doping regions for the drain and source of the charging transistor nevertheless remain smaller than the supply voltage.

In accordance with another feature of the invention, there is provided a terminal for a positive pole of a supply voltage; and a terminal for a negative pole of the supply voltage; the control circuit having a current path with a first transistor connected to the terminal for the positive pole of the supply voltage, and a second transistor connected to the terminal for the negative pole of the supply voltage; the first and second transistors interconnected at a coupling node connected to the gate of the p-channel MOS transistor; and the second transistor being switched on during the first phase, neither of the first and second transistors being switched on during the second phase, and the first transistor being switched on outside the first and second phases.

In accordance with a further feature of the invention, there is provided a circuit configuration driving the second precharging transistor and generating a boosted voltage during and at a time period before the first phase.

In accordance with an added feature of the invention, there is provided a first delay element having an output; a second delay element connected downstream of the first delay element and having an output; the control circuit receiving a control signal delayed by the delay elements; the output of the first delay element driving the first transistor; a logic gate connected between the output of the first delay element and the second transistor for driving the second transistor; the output of the second delay element driving the second transistor through the logic gate; the output of the second delay element driving the other terminal of the boosting capacitor; and a further logic gate receiving the control signal and connected to the other terminal of the boosting capacitor for driving the other terminal of the boosting capacitor.

In accordance with an additional feature of the invention, there is provided a limiting circuit connected to the gate terminal of the p-channel MOS transistor for limiting a potential at the gate terminal to the positive pole of the supply voltage.

In accordance with yet another feature of the invention, there is provided a discharge transistor connected to the output terminal and switched on outside the first and second phases.

In accordance with a concomitant feature of the invention, there is provided a circuit node coupled to the boosting capacitor, the p-channel transistor realized in an n-type well in a p-type substrate, and the well connected to the circuit node.

The effect achieved by precharging transistors at both terminals of the main current path of the charging transistor as well as a discharge transistor on the output side and a corresponding sequence controller, is that during each pumping cycle of the output voltage, a value range from 0 V up to the boosted output voltage value is traversed. At the same time, the voltage at the terminals of the main current path of the charging transistor persistently has the same orientation. The doping well in which the charging transistor is connected can therefore readily be connected to a voltage node located at the side of the boosting capacitor.

Other features which are considered as characteristic for the invention are set forth in the appended claims.

Although the invention is illustrated and described herein as embodied in a circuit configuration for generating a boosted output voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
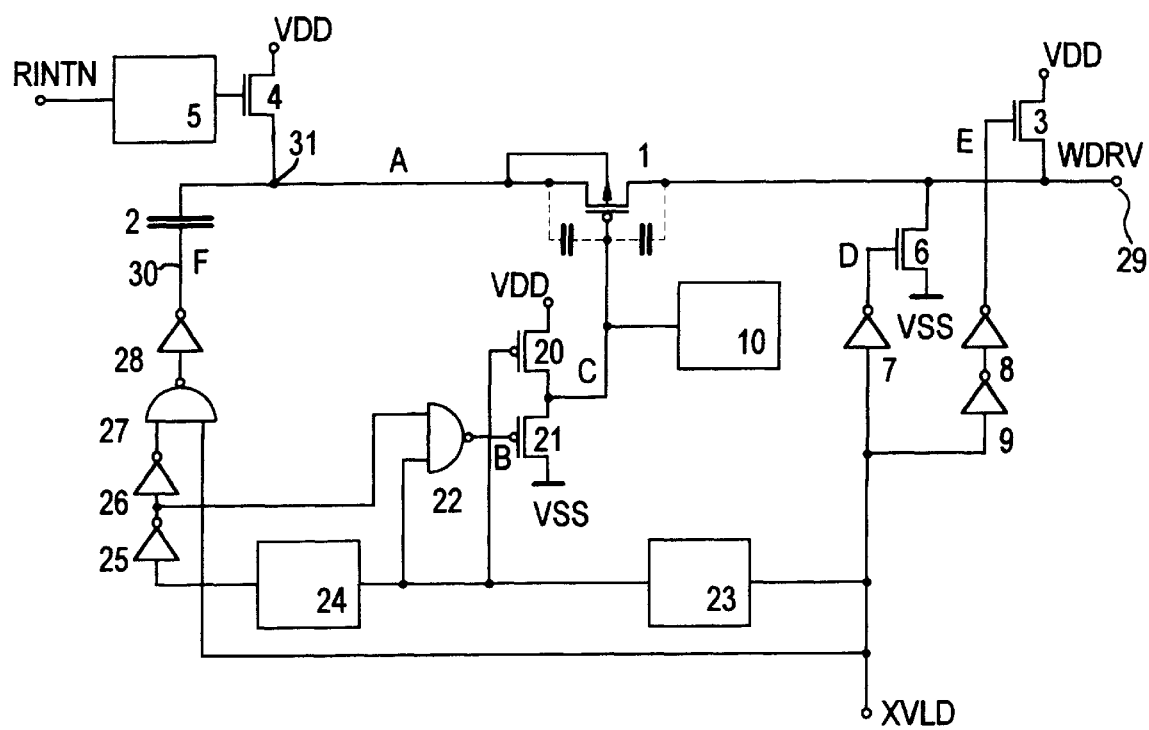
FIG. 1 is a schematic and block circuit diagram of an inventive circuit configuration for generating a boosted output voltage.

Referring now to the figures of the drawings in detail and first, particularly, to FIG. 1 thereof, there is seen a circuit which contains a p-channel MOS transistor 1, having a main current path that is connected between an output terminal or node 29 and a boosting capacitor 2 connected to a node 31. An output signal WDRV is present at the terminal 29 and yields a higher output voltage than that yielded by potentials VDD, VSS of a supply voltage. A first n-channel MOS transistor 3 is connected as a precharging transistor between the output terminal 29 and a terminal for the positive supply potential VDD. A second precharging transistor 4 is disposed between the boosting capacitor-side terminal of the transistor 1 and the supply potential VDD. An n-channel MOS transistor 6 serves as a discharge transistor and is disposed between the output terminal or node 29 and a terminal for the ground potential VSS.

While a terminal 30 of the boosting capacitor 2 which is remote from the transistor 1 is at low level (e.g. ground potential VSS), it is charged through the precharging transistor 4. The output terminal or node 29 is precharged in a corresponding manner through the precharging transistor 3. The transistor 1 is then switched on for the purpose of potential equalization between the nodes 29, 31. Afterwards, its gate terminal is held at a floating potential, and the terminal 30 of the boosting capacitor 2 is raised to high potential (e.g. the potential VDD), with the result that the output signal WDRV has a potential which is boosted by the boosting capacitor voltage above the positive supply potential VDD. During turn-off, the node 29 is discharged through the then switched-on transistor 6 and pulled to ground potential VSS, and the terminal 30 of the boosting capacitor is again put at low potential.

Figure 2:
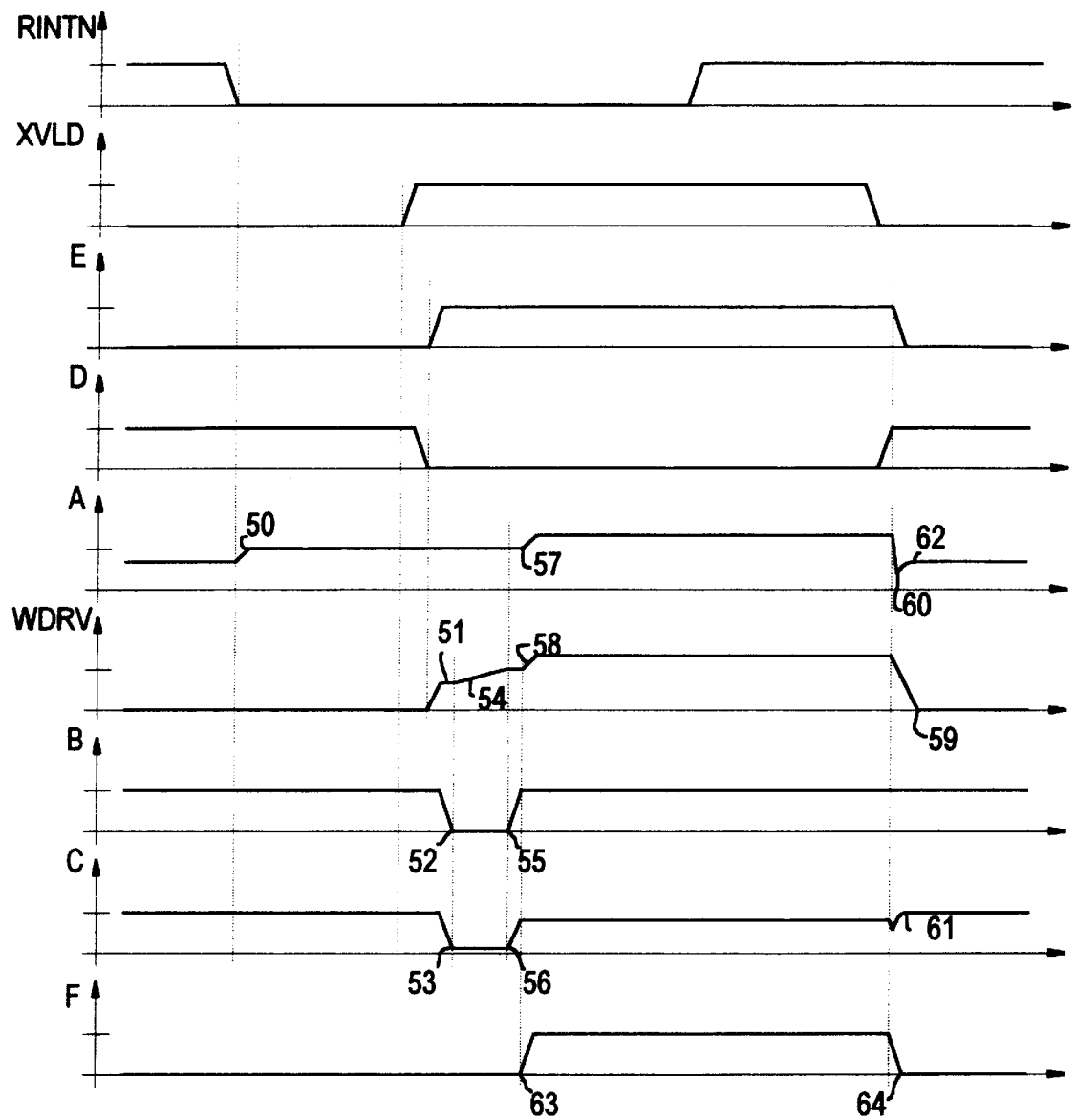
FIG. 2 is a timing diagram of signals occurring in FIG. 1.

The method of operation of the circuit shown in FIG. 1 is described in detail below with reference to the signal profile diagram illustrated in FIG. 2. At the beginning, the node 31 is charged from the positive supply potential VDD through the transistor 4. A signal A at the node 31 then has the positive supply potential minus the threshold voltage of the n-channel transistor 4 (VDD–Vthn). When a signal RINTN is activated, i.e. when the signal RINTN changes from an H to an L level, a configuration 5 is activated which already generates a potential lying above the supply potential VDD, as a result of which the transistor 4 is driven with a sufficiently high gate voltage to cause the node 31 to be completely raised to the supply potential VDD (point 50 in FIG. 2). A pumping operation is initiated with an activation of a signal XVLD. In a semiconductor memory, the signal XVLD is generated when access addresses for the memory cell array are present in a stable manner. A signal D at a gate terminal of the transistor 6 is generated from the signal XVLD through the use of an invertor 7. It has the effect of turning off the discharge transistor 6. Slightly later, an edge of a signal E which drives the gate terminal of the precharging transistor 3 is generated from the signal XVLD through the use of two invertors 8, 9. As a result, the potential at the output terminal 29 is raised to the supply potential VDD minus the threshold voltage of the transistor 3 (point 51). It is important that the transistors 6, 3 be turned off and on, respectively, in a manner which is staggered over time in the way that has just been described, so that no conductive current path exists between the supply voltage terminals.

A gate terminal of the charging transistor 1 is connected to a current path which is connected between the supply voltage VDD, VSS and contains first and second p-channel MOS transistors 20, 21, that have main current paths connected in series. The gate terminal of the transistor 1 is connected to a coupling node of the transistors 20, 21. A gate terminal of the transistor 21 on the ground side is driven through a NAND gate 22. The NAND gate 22 has inputs which are controlled by the signal XVLD. On one hand, the signal XVLD is applied to the NAND gate 22 through a first delay element 23, and on the other hand, the signal XVLD is applied to the NAND gate 22 through a second delay element 24 connected in series with the first delay element 23 as well as an invertor 25. The effect of this configuration is that after the delay time caused by the delay element 23 has elapsed, a signal B at the gate terminal of the transistor 21 is pulled to ground (point 52). As a result, the gate potential of the transistor 1 is put at ground potential VSS plus the threshold voltage of the transistor 21 (VSS+VThp; point 53). The transistor 1 is thus completely switched on, with the result that potential equalization between the nodes 29, 31 ensues (point 54). After the delay caused by the second delay element 24 and the invertor 25, the transistor 21 is turned off again through the NAND gate 22 (points 55, 56).

The terminal 30 of the boosting capacitor 2 is connected through an invertor 28 to a further NAND gate 27. One input of the further NAND gate 27 is driven by the signal XVLD and another input thereof is driven by the signal XVLD delayed by the delay elements 23, 24, the invertor 25 and an invertor 26. The effect of this configuration is that the node 31 is raised from the ground potential VSS to the positive supply potential VDD (points 63, 57). Since the transistors 21, 20 of the current path which drives the gate terminal of the transistor 1 are both in the off state, the gate potential of the transistor 1 has a floating behavior. This means that the gate potential is not held actively at a fixed level, but rather behaves in accordance with the parasitically acting circuitry.

What is particularly active in this case is a parasitic capacitance of the gate with respect to the channel and, moreover, its parasitic capacitance with respect to doping regions of a drain and a source of the main current path of the transistor 1. The capacitance per unit length is essentially set by the gate oxide thickness. The remaining capacitive loading of the gate terminal, for example, with respect to the drain and source doping regions of the transistors 20, 21, is significantly lower than the above-mentioned parasitic capacitances. Since the gate of the transistor 1 is floating, it is capacitively adjusted with the rise of the node 31 through the use of the positive supply potential VDD. The transistor 1 therefore remains sufficiently conductive to pass the potential present at the node 31 on to the output node 29 (point 58). The output signal WDRV is then at the desired boosted output voltage. This enables a transfer transistor driven by the signal WDRV in the cell array of a semiconductor memory to pass the entire operating voltage VDD on to a connected storage capacitor.

In order to increase operational reliability, a circuit 10 is provided which limits the gate potential of the transistor 1 to the positive supply potential VDD. This is intended to prevent a parasitic diode with respect to the n-type well of the p-channel MOS transistor 1 from being switched on. Conventional limiting circuits are provided for the circuit 10. Such a circuit includes, for example, an MOS diode formed by an n-channel MOS transistor having a gate terminal that is connected, together with a terminal of its main current path, to the gate terminal of the transistor 1, and having another terminal of the main current path that is connected to a potential VDD–VThn.

The turn-off operation is initiated by the falling edge of the signal XVLD. In response to this, after a delay provided through the use of the invertor 7, the transistor 6 is turned on and the signal WDRV is pulled down to ground potential (point 59). In the meantime, moreover, after a delay provided through the use of the invertors 8, 9, the signal E is switched over from an H level to an L level. In this case, it must be taken into account that the gate-source voltage of the transistor 3 always lies below its threshold voltage, so that the transistor 3 is turned off and no conductive current path is present between the supply voltage terminals. In an expedient manner, the signal WDRV is always greater than the potential at the gate of the transistor 3, since the discharge edge of the signal E falls more rapidly than the edge of the signal WDRV. This switching behavior of the signals D, E is achieved by appropriate dimensioning of the invertors 7 and 9, 8. When the transistor 6 is turned on, the potential of the node 31 is reduced since the transistor 1 momentarily switches on (point 60). With the falling edge of the signal XVLD, the node 30 is also pulled to ground through the NAND gate 27 and the invertor 28, thereby assisting the discharge of the node 31 (point 64). The transistor 1 is then completely turned off by the transistor 20 which is connected to the potential VDD being switched on (point 61). The node 31 is then once again pulled to the potential VDD–VThn (point 62), with the result that the initial state is present.

In the realization shown in FIG. 1, the terminal of the main current path of the transistor 1 which faces the node 31 always has a higher potential than the terminal of the main current path which faces the output terminal 29. It is therefore expedient to connect the n-type doping well in which the p-channel MOS transistor 1 is realized, given a p-type substrate, to the line path facing the boosting capacitor 2, for example to the corresponding doping region connected thereto. Substrate-well diodes are thus always reliably switched off.

The capacitance of the boosting capacitor 2 is calculated on the basis of capacitive voltage division between the boosting capacitor 2 and the capacitive loading connected to the output terminal 29, while taking account of the desired level of the output voltage. The circuit described herein takes up a relatively small area and has a small number of components. Although the entire voltage range from ground potential (0 V) up to the boosted output voltage lying above the positive supply potential VDD is traversed during each pumping operation, neither critical voltage ratios nor undesirable well effects are produced. The voltages occurring between the gate and the doping regions of the charging transistor 1 are smaller than the supply voltage VSS, VDD, with the result that excessive voltage stress on the gate oxide of the transistor 1 is avoided. The elements 20–28 may collectively be referred to as a control circuit.

I claim:

1. A circuit configuration for generating a boosted output voltage, comprising:

an output terminal for tapping a boosted output voltage;

a p-channel MOS transistor having a main current path connected to said output terminal and having a gate terminal;

a boosting capacitor having one terminal connected to and another terminal remote from said main current path of said p-channel MOS transistor;

a first precharging transistor connected to said output terminal;

a second precharging transistor connected to said boosting capacitor; and a control circuit for ensuring that during a first phase said gate terminal of said p-channel MOS transistor is held at a low potential and said precharging transistors are turned on, that during a second phase said gate terminal of said p-channel MOS transistor has a floating potential, and that said other terminal of said boosting capacitor has a low potential during said first phase and a high potential during said second phase.

2. The circuit configuration according to claim 1, wherein said control circuit includes said control circuit having a current path with a first transistor connected to said terminal for the positive pole of the supply voltage, and a second transistor connected to said terminal for the negative pole of the supply voltage;

said first and second transistors interconnected at a coupling node connected to said gate of said p-channel MOS transistor; and said second transistor being switched on during said first phase, neither of said first and second transistors being switched on during said second phase, and said first transistor being switched on outside said first and second phases; and a terminal for a positive pole of supply voltage and a terminal for a negative pole of the supply voltage.

3. The circuit configuration according to claim 1, including a circuit configuration driving said second precharging transistor and generating a boosted voltage during and at a time period before said first phase.

4. The circuit configuration according to claim 2, wherein said control circuit includes a first delay element having an output;

a second delay element connected downstream of said first delay element and having an output;

said control circuit receiving a control signal delayed by said delay elements;

said output of said first delay element driving said first transistor;

a logic gate connected between said output of said first delay element and said second transistor for driving said second transistor;

said output of said second delay element driving said second transistor through said logic gate;

said output of said second delay element driving said other terminal of said boosting capacitor; and a further logic gate receiving the control signal and connected to said other terminal of said boosting capacitor for driving said other terminal of said boosting capacitor.

5. The circuit configuration according to claim 2, including a limiting circuit connected to said gate terminal of said p-channel MOS transistor for limiting a potential at said gate terminal to said positive pole of the supply voltage.

6. The circuit configuration according to claim 1, including a discharge transistor connected to said output terminal and switched on outside said first and second phases.

7. The circuit configuration according to claim 6, including a circuit node coupled to said boosting capacitor, said p-channel transistor realized in an n-type well in a p-type substrate, and said well connected to said circuit node.

* * * * *